(12) United States Patent
Lovette-Cephus

(10) Patent No.: US 10,945,345 B2
(45) Date of Patent: Mar. 9, 2021

(54) STORAGE APPARATUS AND METHODS OF STORING AND USING ELECTRONIC DEVICES DURING CHARGING

(71) Applicant: Jennifer Lovette-Cephus, Hammond, IN (US)

(72) Inventor: Jennifer Lovette-Cephus, Hammond, IN (US)

(*) Notice: Subject to any disclaimer, the term of this patent is extended or adjusted under 35 U.S.C. 154(b) by 0 days.

(21) Appl. No.: 16/296,024

(22) Filed: Mar. 7, 2019

(65) Prior Publication Data

US 2019/0281713 A1 Sep. 12, 2019

Related U.S. Application Data

(60) Provisional application No. 62/639,657, filed on Mar. 7, 2018.

(51) Int. Cl.
| | |
|---|---|
| *H05K 5/00* | (2006.01) |
| *H05K 5/02* | (2006.01) |
| *H01R 13/639* | (2006.01) |
| *F16M 13/02* | (2006.01) |

(52) U.S. Cl.
CPC ......... *H05K 5/0217* (2013.01); *F16M 13/022* (2013.01); *H01R 13/639* (2013.01); *H05K 5/0204* (2013.01)

(58) Field of Classification Search
CPC ....... H02J 7/0042; H02J 7/0044; H02J 7/0027

USPC ................ 248/441.1, 447.1, 51, 52
See application file for complete search history.

(56) References Cited

U.S. PATENT DOCUMENTS

| | | | |
|---|---|---|---|
| 9,143,180 B2* | 9/2015 | Shen ...................... | H02J 7/0044 |
| 9,655,434 B2* | 5/2017 | Briant ..................... | F16M 11/06 |
| 2011/0187323 A1* | 8/2011 | Gourley .................... | H02J 5/00 320/111 |
| 2012/0206100 A1* | 8/2012 | Brown ..................... | B60L 53/65 320/109 |
| 2014/0126230 A1* | 5/2014 | Harris ...................... | F21V 21/00 362/382 |
| 2016/0198838 A1* | 7/2016 | Abreu ....................... | A45F 5/00 224/183 |

FOREIGN PATENT DOCUMENTS

WO    WO-2008155644 A2 * 12/2008 ............... H02G 3/14

\* cited by examiner

*Primary Examiner* — Steven M Marsh
(74) *Attorney, Agent, or Firm* — Hartman Global IP Law; Gary M. Hartman; Domenica N. S. Hartman

(57) ABSTRACT

A storage apparatus for storing an electronic device coupled to an electrical outlet via a charging apparatus that includes an electrical cord connected to a plug inserted into the electrical outlet. The storage apparatus has a lower portion defining a compartment in which the device may be inserted and stored. An upper portion of the storage apparatus is configured to hang the storage apparatus from the plug of the charging apparatus while the plug is inserted into the electrical outlet to thereby support the lower portion and the device stored therein.

19 Claims, 10 Drawing Sheets

STORAGE APPARATUS AND METHODS OF STORING AND USING ELECTRONIC DEVICES DURING CHARGING

CROSS REFERENCE TO RELATED APPLICATIONS

This application claims the benefit of U.S. Provisional Application No. 62/639,657, filed Mar. 7, 2018, the contents of which are incorporated herein by reference.

BACKGROUND OF THE INVENTION

The present invention generally relates to storage apparatuses. The invention particularly relates to apparatuses and methods for storing and using an electronic device while the device is coupled to and being charged by an electrical outlet.

Use of mobile electronic devices such as mobile phones, tablet computers, laptop computers, etc., has greatly increased in recent decades. Such devices usually utilize rechargeable batteries as a power source that requires occasional charging, commonly by connecting the device to an electrical outlet via a charging apparatus that includes an electrical cord and plug, the latter often being incorporated in a voltage transformer. During the charging process, the mobility of the electronic device is temporarily limited by the length of the cord, which in turn may limit the practical usability of the device. In addition, storage of the device during charging may be complicated if there are no surfaces on which the device may rest that are within the reach of the cord. Depending on the location of the electronic device and outlet, it is also possible that an individual, pet, or object may accidentally snag the cord, causing the device to disconnect from the cord and/or drop from the surface on which the device was placed for charging, potentially damaging the device or its charging apparatus.

In view of the above, it can be appreciated that it would be desirable if a method or system were available for storing an electronic device while the device is connected to an electrical outlet via a charging apparatus.

BRIEF DESCRIPTION OF THE INVENTION

The present invention provides apparatuses and methods suitable for storing devices as the devices are being charged from an electrical outlet.

According to one aspect of the invention, a storage apparatus is provided for storing a device while the device is coupled to an electrical outlet via a charging apparatus that comprises an electrical cord connected to a plug adapted to be inserted into the electrical outlet. The storage apparatus includes upper and lower portions. The lower portion defines a compartment configured to receive and store the device. The lower portion has an upper opening that allows the device to pass therethrough into the compartment and has a slot to allow the electrical cord to pass therethrough and connect with the device within the compartment. The upper portion has a loop sized and configured to receive the plug and hang the storage apparatus from the plug while the plug is inserted into the electrical outlet to thereby support the device stored within the lower portion.

According to another aspect of the invention, a method is provided for storing a device that is coupled to an electrical outlet via a charging apparatus comprising an electrical cord connected to a plug adapted to be inserted into the electrical outlet. The method includes hanging an upper portion of a storage apparatus from the plug of the charging apparatus while the plug is inserted into the electrical outlet and inserting the device into a compartment of the storage apparatus such that the storage apparatus and the device therein hang from the plug. The compartment is defined by a lower portion of the storage apparatus that is connected to the upper portion.

Technical effects of the storage apparatus and method described above preferably include the ability to conveniently store and/or utilize an electronic device while the device is recharging.

Other aspects and advantages of this invention will be appreciated from the following detailed description.

DETAILED DESCRIPTION OF THE INVENTION

FIGS. 1 through 10 disclose nonlimiting embodiments of hanging storage apparatuses configured to suspend an electronic device from an electrical outlet while a battery of the electronic device is being charged. The storage apparatus is intended to be used in conjunction with a charging apparatus that includes an electrical cord and plug, often incorporated in a voltage transformer, that is adapted to be plugged into an electrical outlet.

Figure 1:
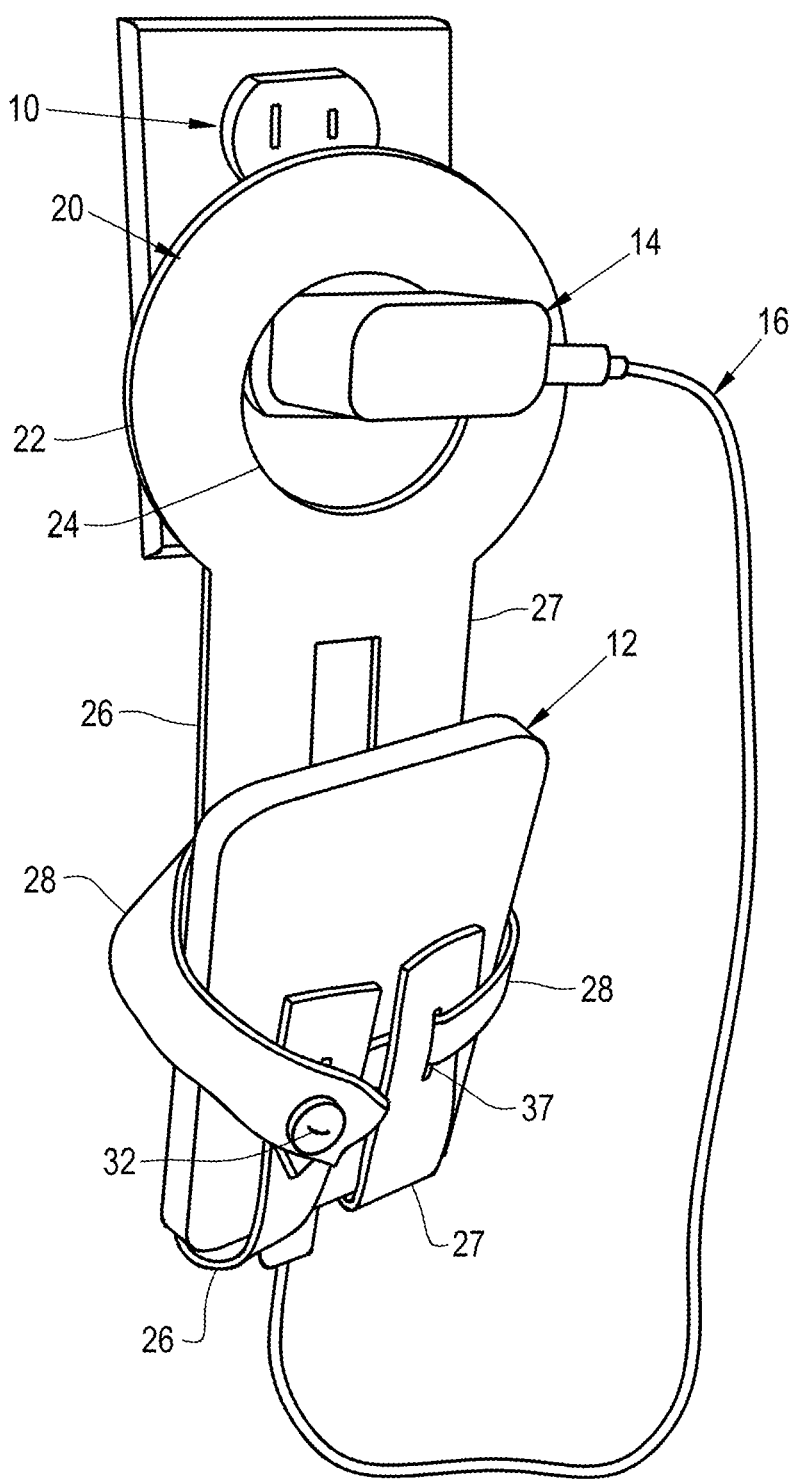
FIG. 1 represents a first nonlimiting embodiment of a hanging storage apparatus used to store a mobile phone while the phone is plugged into an electrical wall outlet with a charging apparatus in accordance with certain aspects of the present invention.

To facilitate the description provided below of the embodiments represented in the drawings, relative terms, including but not limited to, "vertical," "horizontal," "lateral," "front," "rear," "side," "forward," "rearward," "upper," "lower," "above," "below," "upward," "downward," etc., may be used in reference to the orientation of the storage apparatus as installed on a conventional electrical outlet as represented in FIG. 1, and therefore are relative terms that indicate the construction, installation and use of the invention and therefore help to define the scope of the invention.

FIG. 1 shows a first nonlimiting hanging storage apparatus 20 that is being used to store a mobile phone 12 while the phone 12 is being charged in an electrical outlet 10 on a wall. As shown, the phone 12 is coupled to the outlet 12 with a charging apparatus that comprises a cord 16 connected to a transformer (as a matter of convenience, referred to hereinafter as a plug) 14, which is shown in FIG. 1 as plugged into one of the sockets of the outlet 10. The storage apparatus 20 comprises a body that includes an upper portion configured to support the storage apparatus 20 from the plug 14 when the plug 14 is inserted into an outlet 10, and a lower portion that is configured to store and support an electronic device, in this instance the phone 12.

Figure 2:
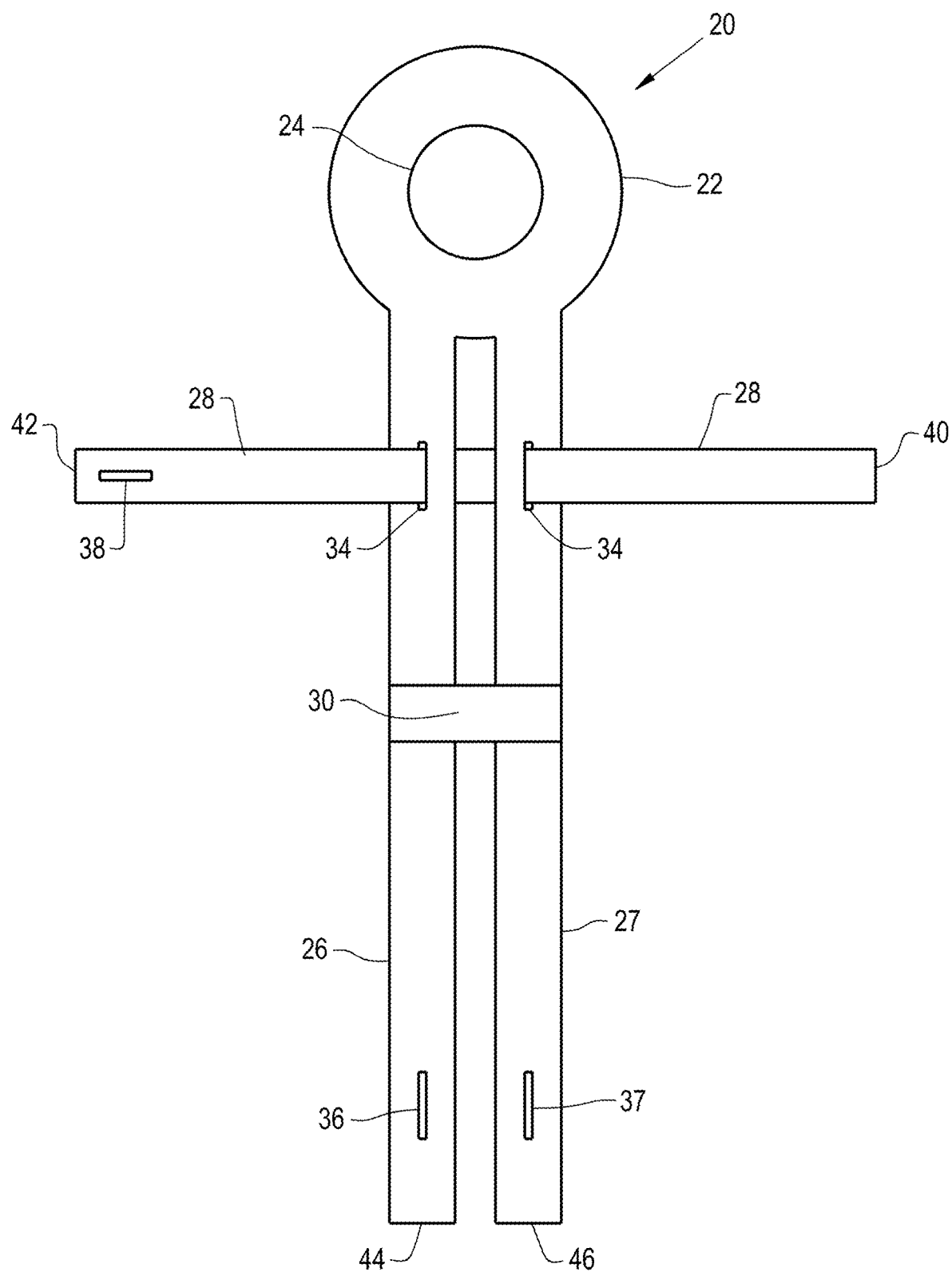
FIGS. 2 and 3 represent the storage apparatus of FIG. 1 in open and fully closed configurations, respectively.
Figure 3:
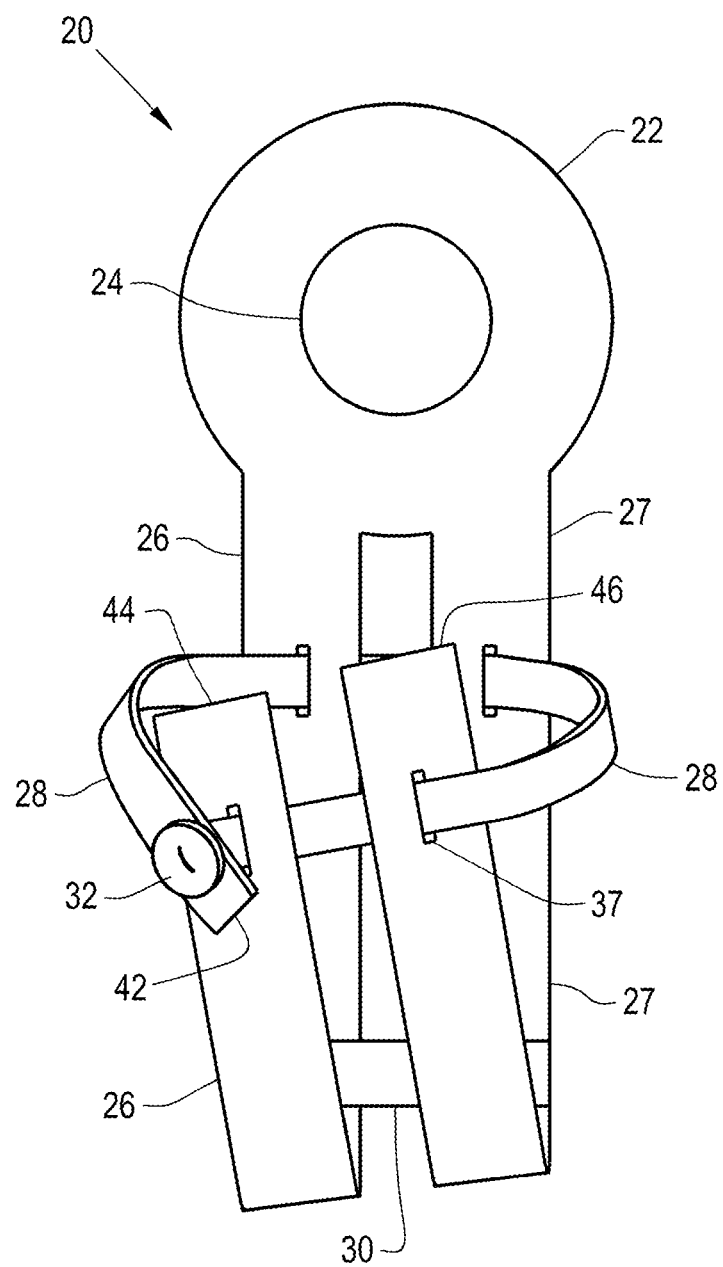

FIGS. 2 and 3 represent the storage apparatus 20 of FIG. 1 in open and fully closed configurations, respectively. The upper portion is represented in FIGS. 2 and 3 as comprising an annular-shaped closed loop 22 that defines an opening 24 surrounded by an interior edge of the loop 22. The opening 24 in the loop 22 is sufficiently large to allow the plug 14 to pass therethrough as represented in FIG. 1. As best seen in FIG. 2, the lower portion of the storage apparatus 20 comprises two straps (referred to hereinafter as "base straps") 26 and 27 extending from the upper portion and in the fully closed configuration define a base of the storage apparatus 20. The lower portion of the storage apparatus 20 further comprises a strap (referred to hereinafter as a "fastening strap") 28 extending across the base straps 26 and 27 through slots 34 therein, and a strap (referred to hereinafter as a "support strap") 30 extending between the base straps 26 and 27 as a support that connects and laterally stabilizes the base straps 26 and 27 to maintain the base straps 26 and 27 roughly parallel to each other and maintain a gap therebetween.

In the fully closed configuration, the fastening strap 28 defines a fastening means that secures oppositely-disposed distal ends 40 and 42 of the fastening strap 28 together and also interconnects distal ends 44 and 46 of the base straps 26 and 27, as seen in FIG. 3. In the open configuration of FIG. 2, oppositely-disposed portions of the fastening strap 28 extending laterally outwardly in opposite directions from the base straps 26 and 27 are oriented such that their longitudinal axes are substantially aligned with one another and perpendicular to the longitudinal axis of each base strap 26 and 27. As shown in FIG. 3, the storage apparatus 20 is placed in its fully closed configuration by bending or folding the base straps 26 and 27 over their longitudinal axes such that the ends 44 and 46 of the base straps 26 and 27 extend upward toward the upper portion of the apparatus 20. The oppositely-disposed portions of the fastening strap 28 are each bent over its longitudinal axis such that the distal ends 40 and 42 of the fastening strap 28 extend inward toward the base straps 26 and 27. The ends 40 and 42 of the fastening strap 28 are inserted through slots 36 and 37 in the base straps 26 and 27, respectively, and then interconnect the base straps 26 and 27 by coupling the ends 40 and 42 to each other. In this configuration, the base straps 26 and 27 and fastening strap 28 cooperate to define a pocket-like compartment configured to removably store the phone 12 (or other electronic device), the fastening strap 28 defines an upper opening through which the phone 12 can be placed in the compartment, and the gap between the base straps 26 and 27 provides an opening or slot that is located opposite from the upper opening defined by the fastening straps 28 and is sufficiently narrow to prevent the phone 12 within the compartment from unintentionally escaping the storage apparatus 20, but sufficiently wide to allow the electrical cord 16 to pass therethrough and connect with the phone 12 supported by the base straps 26 and 27 within the compartment. In the nonlimiting embodiment of FIGS. 2 and 3, the ends 40 and 42 of the fastener strap 28 are coupled as a result of a button 32 attached to the end 40 being received in a slot 38 in the other end 42. In this manner, the straps 26, 27, and 28 are temporarily and reversibly (i.e., not permanently) secured together.

Figure 4:
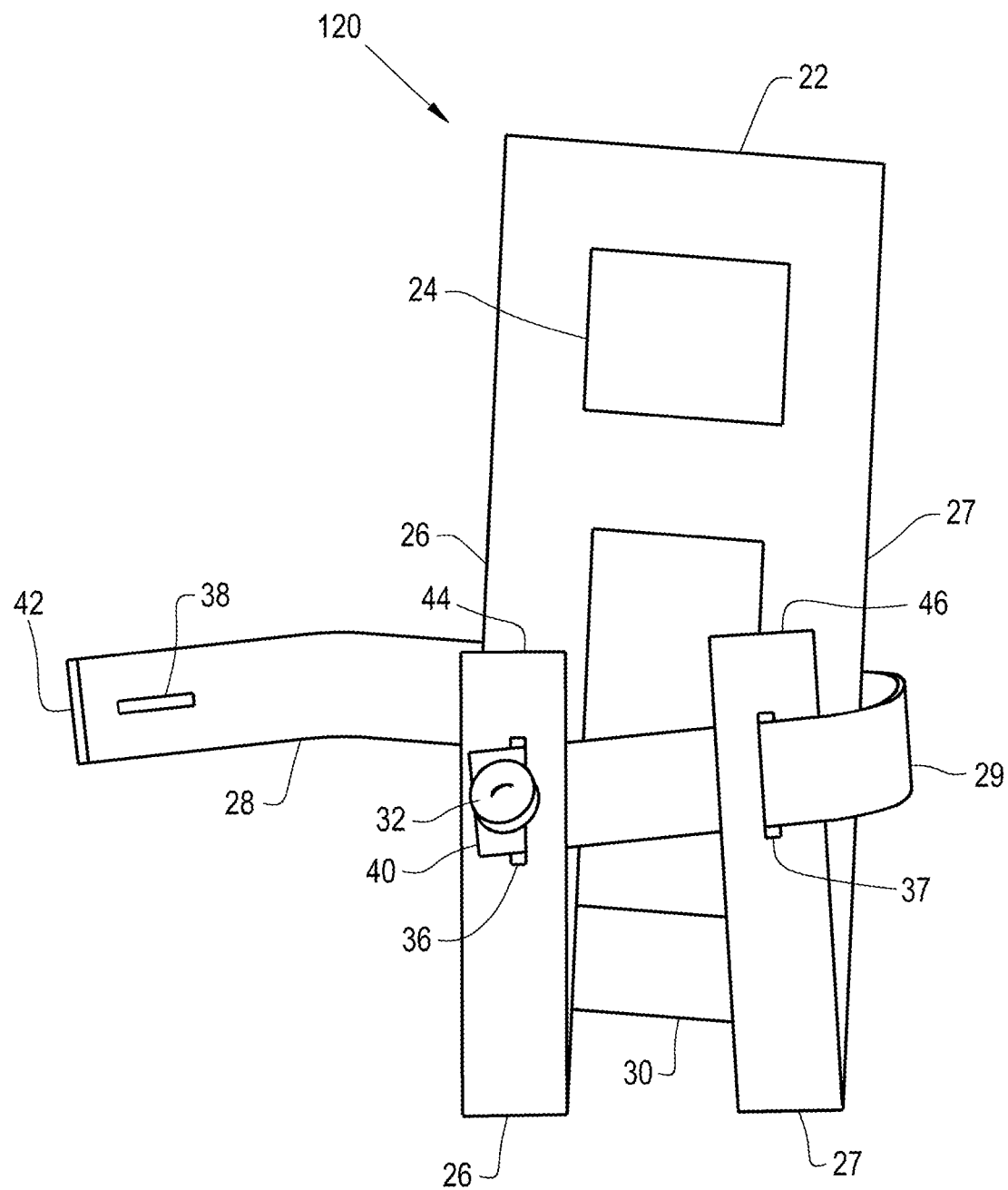
FIGS. 4 and 5 represent a second nonlimiting embodiment of a hanging storage apparatus in partially-closed and fully closed configurations, respectively, in accordance with certain aspects of the present invention.
Figure 5:
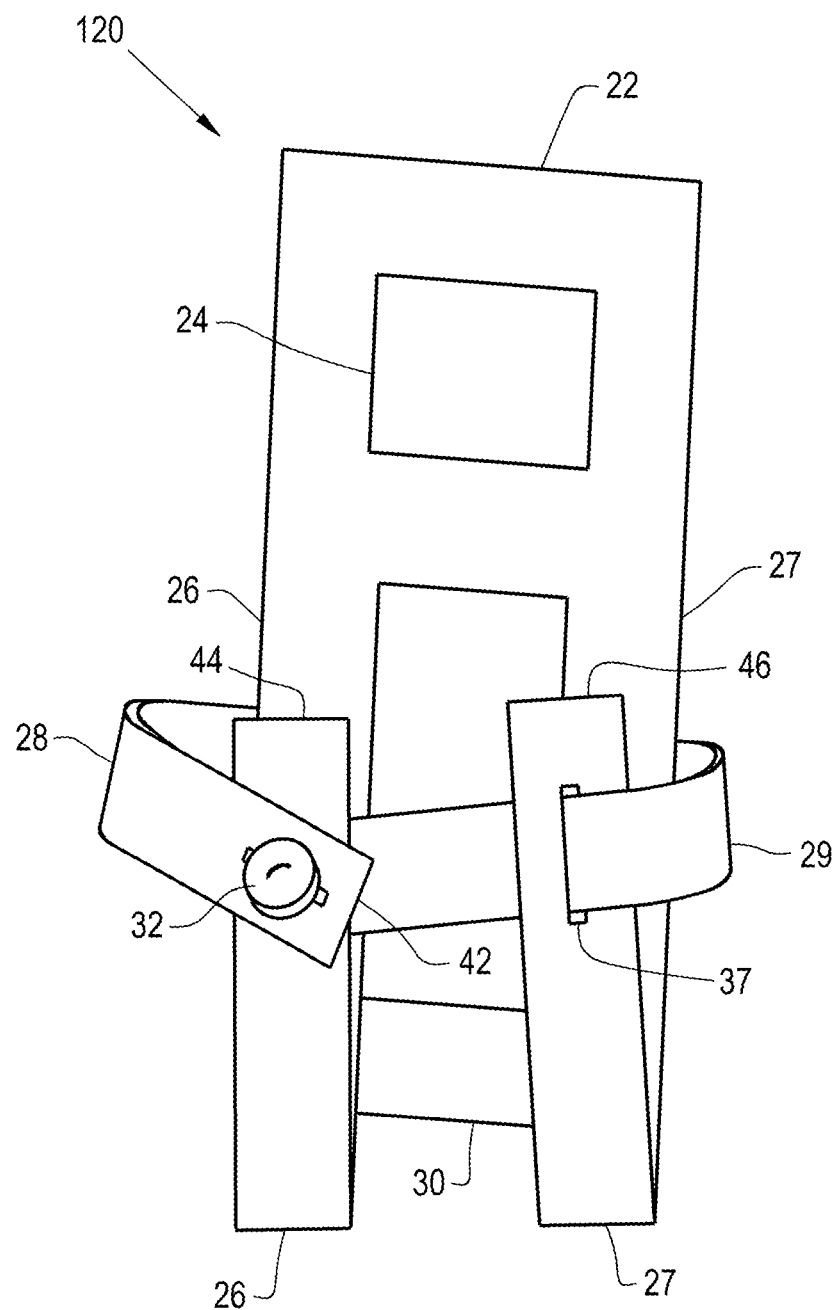
Figure 6:
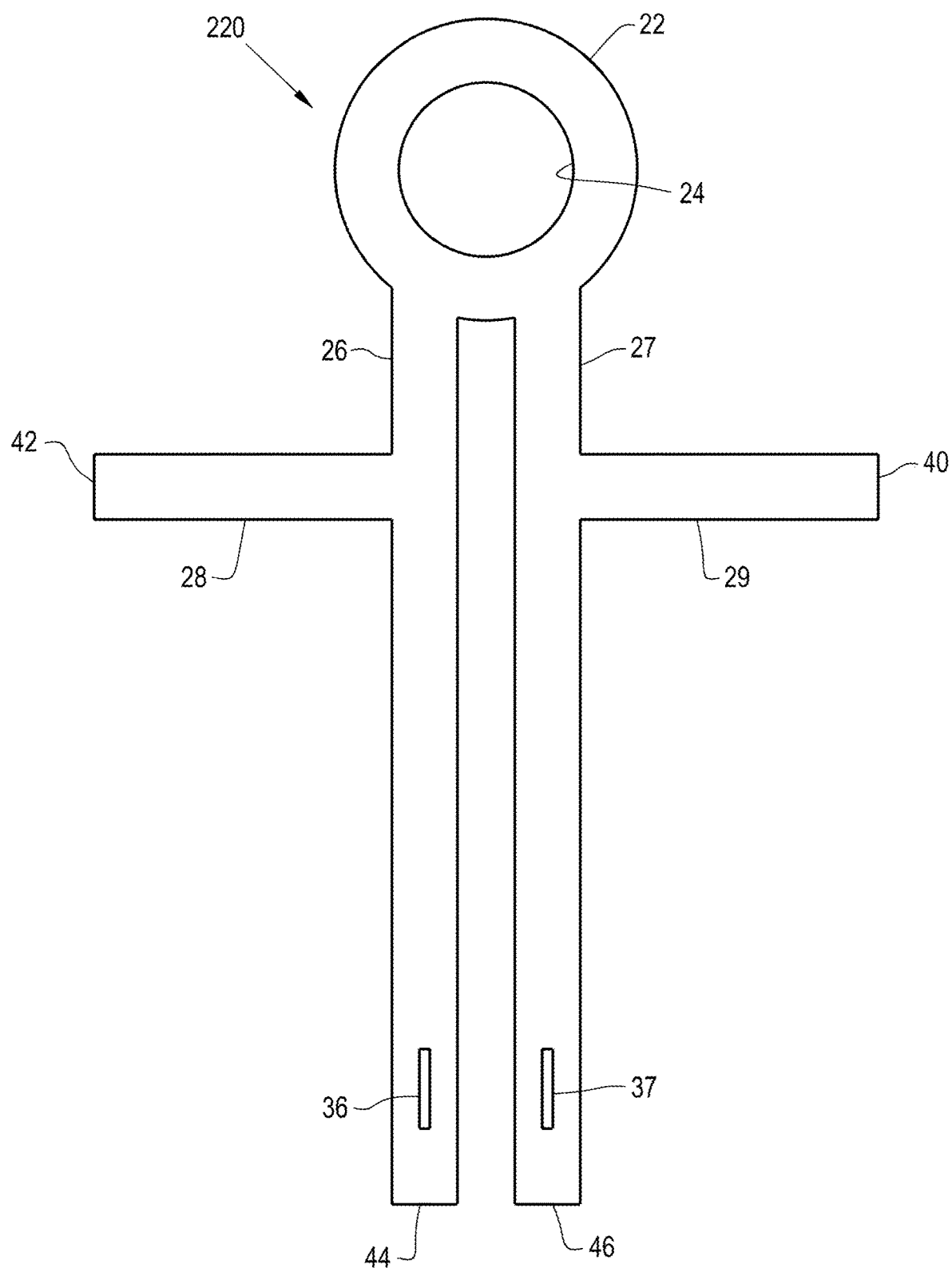
FIG. 6 represents a third nonlimiting embodiment of a hanging storage apparatus in an open configuration in accordance with certain aspects of the present invention.

FIGS. 4 through 6 show additional embodiments of nonlimiting hanging storage apparatuses similar to but having various modifications relative to the storage apparatus 20 of FIGS. 1 through 3. For convenience, consistent reference numbers are used throughout these drawings to identify the same or functionally equivalent elements. Other aspects of the embodiments represented in FIGS. 4 through 6 and not discussed in any detail can be, in terms of structure, function, materials, etc., essentially as was described for the embodiment of FIGS. 1 through 3.

FIGS. 4 and 5 show a storage apparatus 120 having an upper portion with a square-shaped loop 22 that defines a square-shaped opening 24, rather than the circular-shaped loop 22 and opening 24 of FIGS. 1 through 3. It will be understood that the upper portion may have various closed or open shapes (for example, a hook) that are capable of supporting the body from a plug. In addition, the body includes two separate fastening straps 28 and 29 permanently fixed to respective base straps 26 and 27, rather than one continuous fastening strap 28 passing through both base straps 26 and 27.

Similar to the storage apparatus of FIGS. 4 and 5, FIG. 6 represents a storage apparatus 220 whose body includes two fastening straps 28 and 29 rather than a single fastening strap 28. In this embodiment, the body is transitioned to the fully closed configuration by bending the base straps 26 and 27 over their longitudinal axis such that their ends 44 and 46 extend upward, and then inserting buttons (not shown) on the ends 40 and 42 of the fastening straps 28 and 29 into the slots 36 and 37 located adjacent the ends 44 and 46 of the base straps 26 and 27. Although this embodiment is represented as not including a support strap, the storage apparatus 220 may be modified to include one or more support straps that connect and laterally stabilize the base straps 26 and 27.

Although the fastening straps 28 and 29 are shown in FIGS. 1 through 6 as using buttons 32 and slots 34, 36, 37, and/or 38 to temporarily and reversibly secure the storage apparatus in the fully closed configuration, it is within the scope of the invention that any suitable fastening device may be used to secure the straps 26, 27, 28, and/or 29 together, including but not limited to snaps, hook and loop fasteners, hooks, etc.

The structures of the storage apparatuses 20, 120, and 220 are not limited to the embodiments shown in the Figures. For example, the base straps 26 and 27 could be formed by only one strap or more than two straps, as long as they do not interfere with the connection between the electrical cord and the electronic device. Further, the body could include additional fastening straps along the longitudinal axes of the base straps 26 and 27, each of which could include a fastener for connecting ends of the respective fastening strap. The bodies of the storage apparatuses 20, 120, and 220 may be formed from various materials, including but not limited to sewn fabric materials and polymeric materials. It is within the scope of the invention that the lower portion could include a fixed or collapsible basket, pocket, or other enclosure rather than being formed by the base straps 26 and 27, fastening straps 28 and 29, and optional support strap(s) 30. Although the storage apparatuses 20, 120, and 220 are represented as being substantially planar or relatively flat in the open configuration, it is within the scope of the invention that the storage apparatuses 20, 120, and 220 could have other open configuration arrangements.

FIGS. 7 through 10 show an alternate embodiment of a nonlimiting hanging storage apparatus 300 configured to store an electronic device, again represented as a mobile phone 12. In the embodiment of FIGS. 7 through 10, the device is capable of being charged while lying in a horizontal orientation to facilitate watching a movie or the like while the electronic device is being charged. As such, the storage apparatus 300 includes a window configured to allow a user to view a display screen of the phone 12 while stored in the storage apparatus 300. Such a window is preferably equal to or larger than the display screen of the phone 12.

Figure 7:
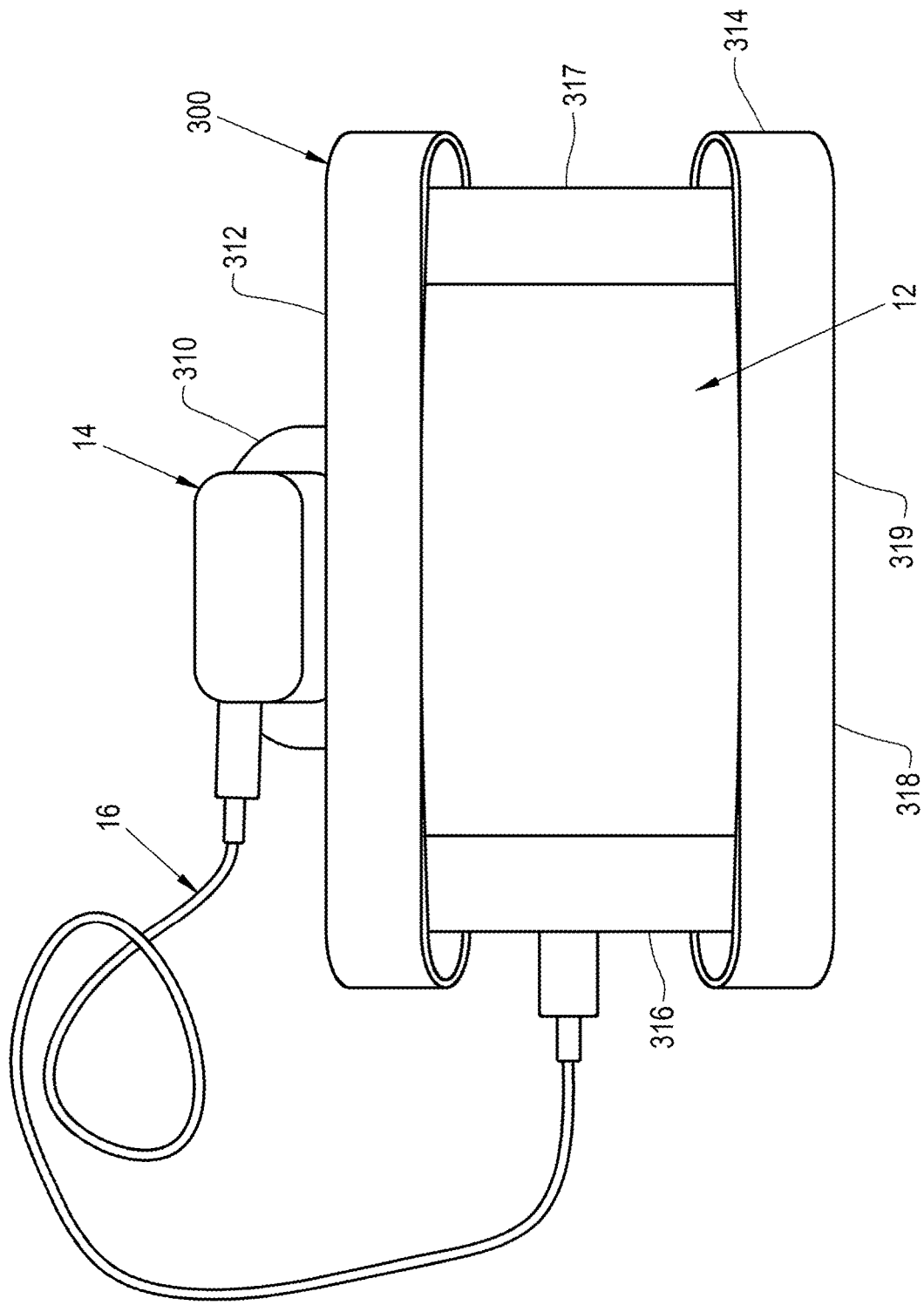
FIG. 7 represents a fourth nonlimiting embodiment of a hanging storage apparatus used to store a mobile phone while the phone is pulled into an electrical wall outlet with a charging apparatus in accordance with certain aspects of the present invention.
Figure 8:
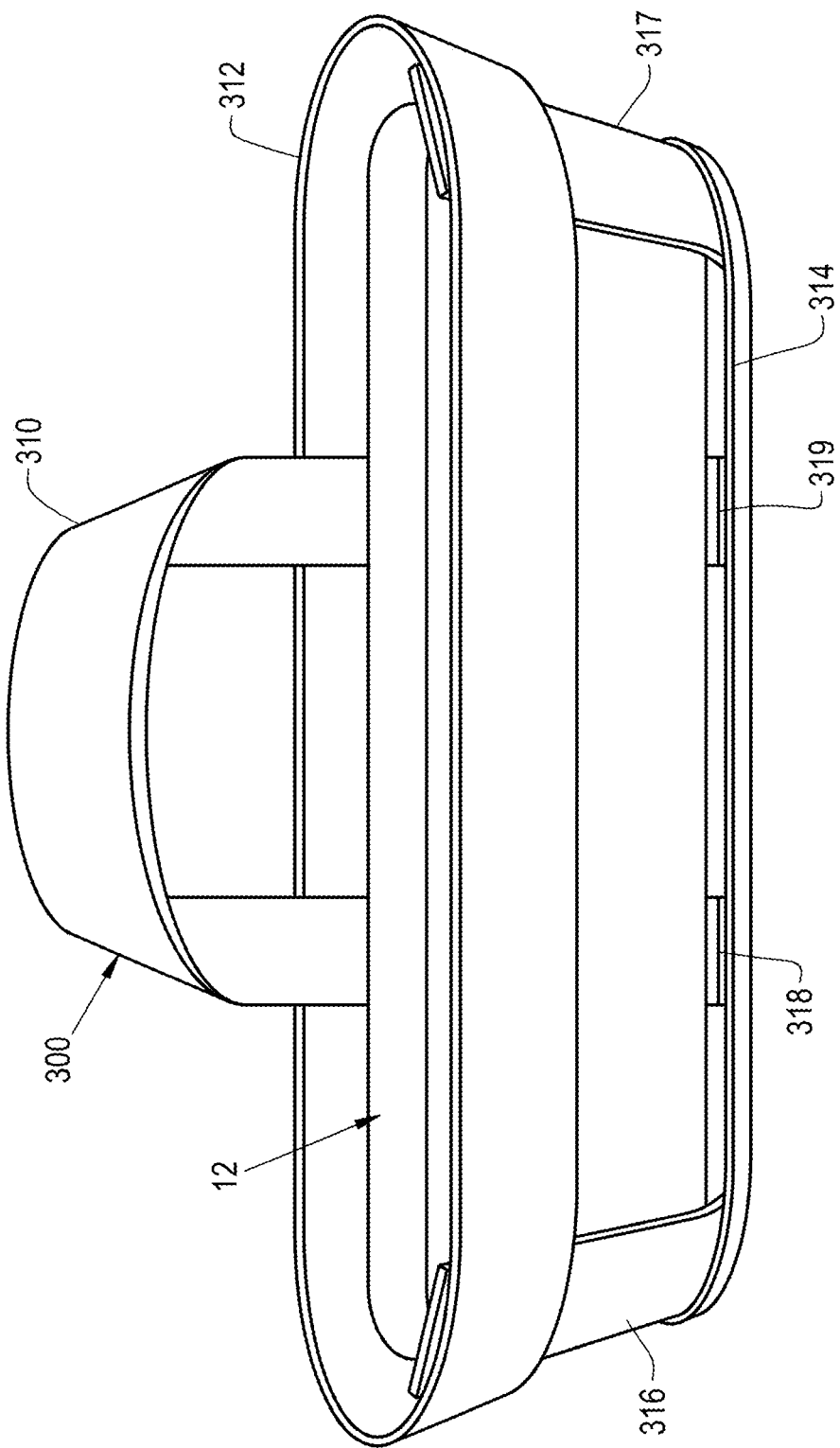
FIGS. 8, 9, and 10 represent top perspective, bottom perspective, and rear views, respectively, of the storage apparatus of FIG. 7.
Figure 9:
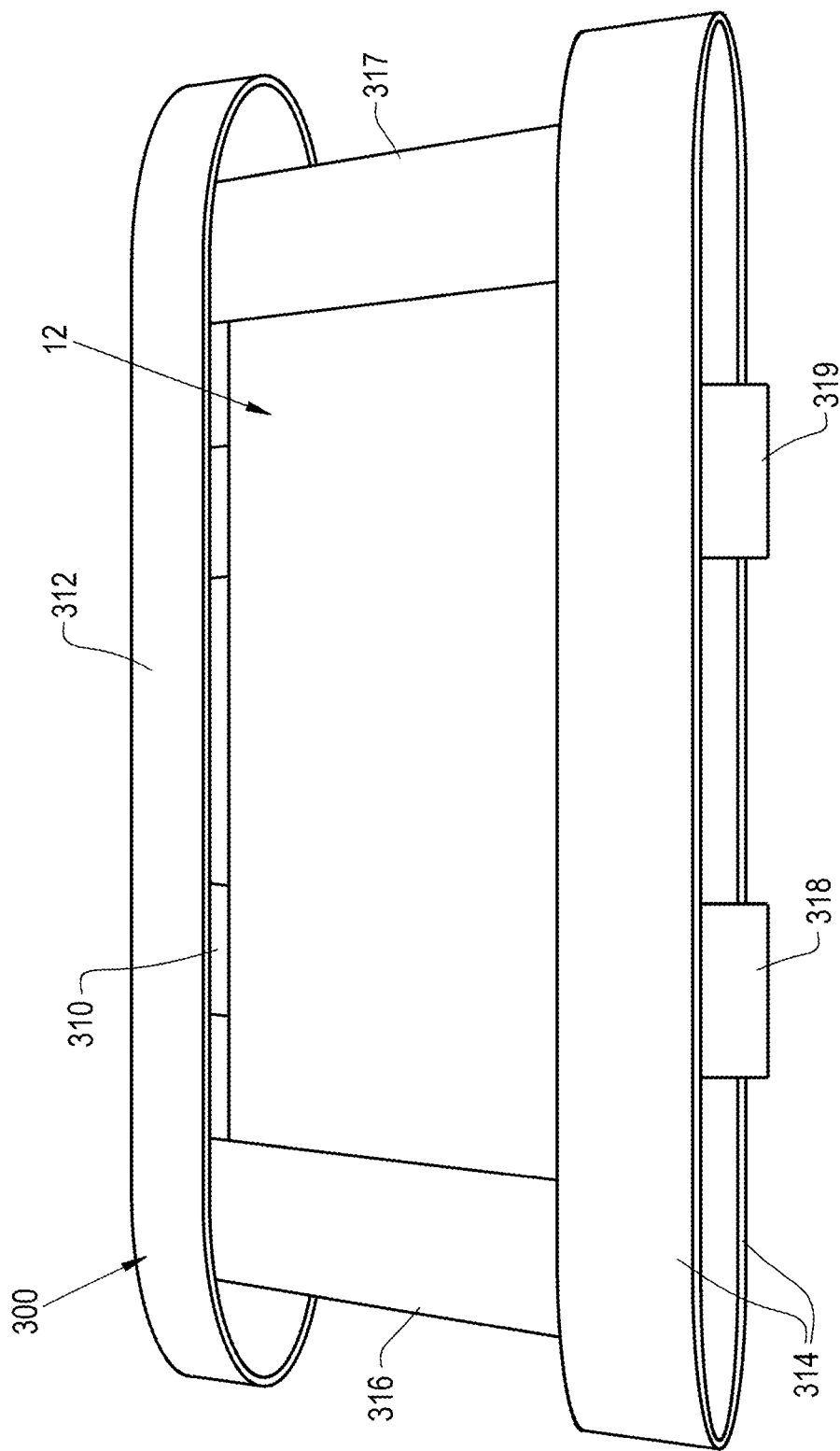
Figure 10:
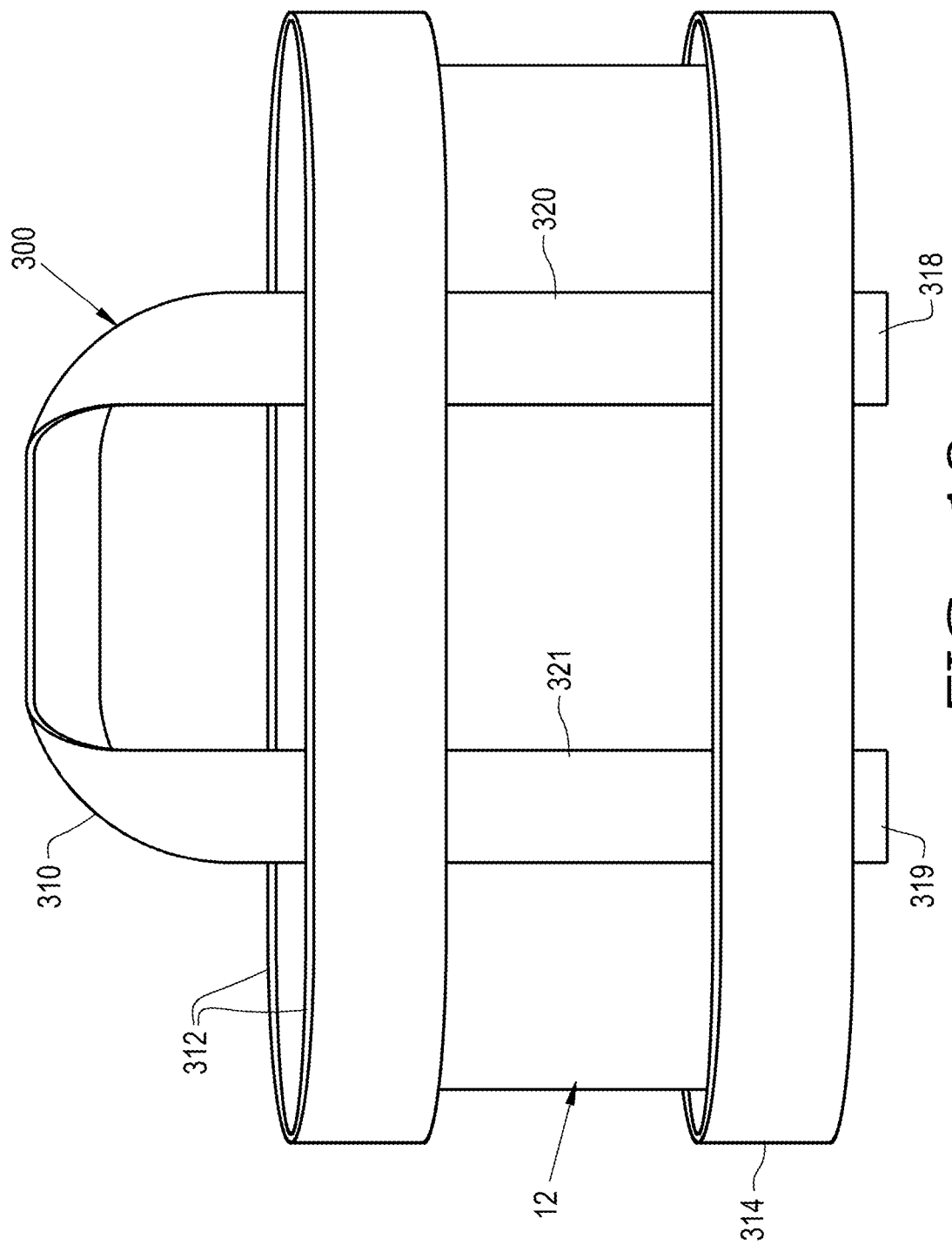

FIG. 7 represents the phone 12 as coupled to an outlet with a cord 16 and plug 14 that is inserted into one of the sockets of the outlet. The storage apparatus 300 comprises a body that includes an upper portion configured to support the storage apparatus 300 from the plug 14 when the plug 14 is inserted into an outlet, and a lower portion that is configured to store and support the phone 12.

The upper portion of the body of the storage apparatus 300 comprises a strap 310 that forms a loop defining a hole that is configured to receive a plug 14 therein. The lower portion of the body of the storage apparatus 300 comprises a strap 312 connected to the loop of the upper portion and extending circumferentially to define a generally horizontal loop corresponding to what may be referred to as the top of the lower portion. The loop defined by the strap 312 is preferably of sufficient size to define a flexible upper opening through which an electronic device can be placed within the apparatus 300. Another strap 314 similarly extends circumferentially to define a generally horizontal loop that is approximately parallel to and spaced apart from the strap 312 to form what may be referred to as the bottom of the lower portion. The straps 312 and 314 are referred to hereinafter as upper and lower circumferential straps 312 and 314.

The upper and lower circumferential straps 312 and 314 are connected at a front of the lower portion by a pair of vertical straps 316 and 317 (referred to hereinafter as "front straps"). A pair of vertical straps 320 and 321 (referred to hereinafter as "rear straps") connect the upper and lower circumferential straps 312 and 314 at a rear of the lower portion. The front and rear straps 316, 317, 320, and 321 vertically space apart the horizontal loops formed by the upper and lower circumferential straps 312 and 314 to create a side opening through which the electrical cord 16 can pass to connect with the phone 12 within the storage apparatus 300, as shown in FIG. 7. Two or more straps 318 and 319 (referred to hereinafter as "base straps") can be seen in FIG. 9 as connecting oppositely-disposed regions of the lower circumferential strap 314 near the bottom of the lower portion. In combination, the upper and lower circumferential straps 312 and 314, front straps 316 and 317, rear straps 320 and 321, and base straps 318 and 319 define a pocket-like compartment configured to removably store the phone 12 (or other electronic device), and the base straps 318 and 319 bridge the horizontal loop formed by the lower circumferential strap 314 to prevent the phone 12 within the compartment from unintentionally escaping the apparatus 300. In preferred embodiments, the upper and lower circumferential straps 312 and 314 and the front straps 316 and 317 frame a window on the front side of the storage apparatus 300, and a majority or entirety of the display screen of the phone 12 is viewable through the window without obstruction while the storage apparatus 300 is hanging from the plug 14 inserted in an electrical outlet.

The structure of the storage apparatus 300 is not limited to the embodiments shown in the drawings. For example, the body could include fewer or additional upper and lower circumferential straps 312 and 314, front straps 316 and 317, rear straps 320 and 321, and base straps 318 and 319 as long as they do not interfere with the connection between the electrical cord and the electronic device. It is within the scope of the invention that the lower portion could include a fixed or collapsible basket, pocket, or other enclosure rather than being formed of the upper and lower circumferential straps 312 and 314, front straps 316 and 317, rear straps 320 and 321, and base straps 318 and 319. For example, the lower portion could be formed of a substantially integral material that defines an enclosed pocket with openings including but not limited to an opening for inserting an electronic device in the lower portion (e.g., across the top of the lower portion as represented in the figures or along one of the ends of the pocket) and an opening for viewing the screen of the electronic device.

The body of the storage apparatus 300 may be formed from various materials including but not limited to sewn fabric materials and polymeric materials. Although connections between the upper and lower circumferential straps 312 and 314, front straps 316 and 317, rear straps 320 and 321, and base straps 318 and 319 are represented in the figures as being fixed, it is within the scope of the invention that one or more of the connections may be releasably coupled with a fastening device in a manner similar to those represented for the storage apparatuses 20, 120, and 220 of FIGS. 1 through 6. Suitable fastening devices may include but are not limited to buttons/slots, snaps, hook and loop fasteners, hooks, etc.

Although the invention has been described in reference to storing mobile phones, it should be noted that the teachings of the invention are not limited to this particular application. Rather, the storage apparatuses 20, 120, 220, and 300 may be appropriately sized and shaped to store a variety of other devices including but not limited to tablet computers, laptop computers, and other mobile electronic devices. In addition, it should be noted that the drawings are not necessarily to scale, and the components may vary in relative size, particularly if used for storing electronic devices other than mobile phones, or mobile phones having relative dimensions different from those represented in the drawings.

Therefore, while the invention has been described in terms of specific or particular embodiments, it should be apparent that alternatives could be adopted by one skilled in the art. For example, the storage apparatuses 20, 120, 220, and 300 and their components could differ in appearance and construction from the embodiments described herein and shown in the drawings, and various materials could be used in the fabrication of the storage apparatuses 20, 120, 220, and 300 and/or their components. In addition, the invention encompasses additional or alternative embodiments in which one or more features or aspects of the different disclosed embodiments may be combined or eliminated. Accordingly, it should be understood that the invention is not necessarily limited to any embodiment described herein or shown in the drawings. Therefore, the scope of the invention is to be limited only by the following claims.

The invention claimed is:

1. A storage apparatus for storing a device coupled to an electrical outlet via a charging apparatus that comprises an electrical cord connected to a plug adapted to be inserted into the electrical outlet, the storage apparatus comprising:

a lower portion defining a compartment configured to receive and store the device, the lower portion having an upper opening that allows the device to pass therethrough into the compartment and having a slot to allow the electrical cord to pass therethrough and connect with the device within the compartment; and an upper portion having a loop sized and configured to receive the plug and hang the storage apparatus from the plug while the plug is inserted into the electrical outlet and thereby support the device stored within the lower portion;

wherein the lower portion is configured to transition between open and fully closed configurations, and wherein the fully closed configuration provides the compartment configured to receive the device.

2. The storage apparatus of claim 1, wherein the upper and lower portions are substantially planar when in the open configuration.

3. The storage apparatus of claim 1, wherein the lower portion comprises:

a base strap connected to and extending away from the upper portion, the base strap having a corresponding longitudinal axis along an elongated length thereof; and one or more fastening straps connected to the base strap to define the upper opening that allows the device to pass therethrough into the compartment, the one or more fastening straps each having a corresponding longitudinal axis along an elongated length thereof, the fastening strap protruding outwardly from the base strap such that the longitudinal axis of the one or more fastening straps is perpendicular to the longitudinal axis of the base strap, the one or more fastening straps including ends located on oppositely disposed sides of the base strap;

wherein in the fully closed configuration the base strap is bent over the longitudinal axis thereof, the one or more fastening straps are bent over the longitudinal axis thereof, the base strap is coupled with the one or more fastening straps such that the one or more fastening straps and base strap are retained in bent configurations to define the compartment configured to removably store the device, and the one or more fastening straps define the upper opening of the lower portion.

4. The storage apparatus of claim 3, wherein at least a first of the one or more fastening straps extends across and through one or more slots in the base strap with portions of the first fastening strap extending outward from the base strap in oppositely-disposed and aligned directions.

5. The storage apparatus of claim 3, wherein the lower portion comprises at least two of the base strap and at least two of the one or more fastening straps, a first of the fastening straps is connected to a first of the base straps and a second of the fastening straps is connected to a second of the base straps, in the open configuration the first and second fastening straps extend outward from the base straps in oppositely-disposed directions and the longitudinal axes of the one or more fastening straps are aligned, and in the fully closed configuration the base straps define a gap therebetween that forms the slot that allows the electrical cord to pass therethrough and connect with the device within the compartment.

6. The storage apparatus of claim 3, wherein a first of the ends of the one or more fastening straps includes a slot therethrough and an oppositely-disposed second of the ends of the one or more fastening straps includes a button, and the first and second ends are configured to couple to one another in the fully closed configuration by inserting the button into the slot.

7. The storage apparatus of claim 3, wherein the lower portion comprises at least two base straps, each of the ends of the one or more fastening straps includes a button, each of the base straps include one or more slots therethrough, and the ends of the one or more fastening straps are configured to couple to the base straps in the fully closed configuration by inserting each of the buttons into a corresponding one of the one or more slots.

8. The storage apparatus of claim 3, wherein the lower portion comprises at least two of the base strap to define a gap therebetween that forms the slot that allows the electrical cord to pass therethrough and connect with the device within the compartment, and the lower portion comprises one or more support straps connecting and laterally stabilizing the base straps.

9. The storage apparatus of claim 1, wherein the device includes a display screen and the lower portion includes a window configured to allow a user to view the display screen while the device is stored in the lower portion.

10. The storage apparatus of claim 9, wherein the lower portion comprises:

a pair of spaced apart circumferential straps extending circumferentially in a loop about the lower portion, a first of the circumferential straps connected to the upper portion and forming the upper opening that allows the device to pass therethrough into the compartment;

a pair of front straps connecting the circumferential straps on a first side of the lower portion;

one or more rear straps connecting the circumferential straps on a second side of the lower portion; and one or more base straps extending between and connecting oppositely-disposed sides of a second of the circumferential straps;

wherein the circumferential straps, the front straps, the one or more rear straps, and the one or more base straps define the compartment configured to removably store the device, and the circumferential straps define a gap therebetween that forms the slot that allows the electrical cord to pass therethrough and connect with the device within the compartment.

11. The storage apparatus of claim 10, wherein the circumferential straps and the front straps define the window and the window is equal to or larger than the display screen.

12. The storage apparatus of claim 9, wherein the display screen is elongated in a first direction relative to a second direction that is perpendicular to the first direction, and the lower portion is configured to store the device such that the first direction is substantially aligned with the horizon.

13. A method for storing a device that is coupled to an electrical outlet via a charging apparatus that comprises an electrical cord connected to a plug adapted to be inserted into the electrical outlet, the method comprising:

hanging an upper portion of a storage apparatus from the plug of the charging apparatus while the plug is inserted into the electrical outlet;

inserting the device through an upper opening of the storage apparatus and into a compartment of the storage apparatus such that the storage apparatus and the device therein hang from the plug, the compartment being defined by a lower portion of the storage apparatus that is connected to the upper portion; and passing the electrical cord through a slot in the storage apparatus to connect with the device within the compartment.

14. The method of claim 13, further comprising transitioning the lower portion from an open configuration to a fully closed configuration, wherein the fully closed configuration provides the compartment configured to receive the device.

15. The method of claim 14, wherein the lower portion comprises:
   a base strap connected to and extending away from the upper portion, the base strap having a corresponding longitudinal axis along an elongated length thereof; and
   one or more fastening straps connected to the base strap to define the upper opening that allows the device to pass therethrough into the compartment, the one or more fastening straps each having a corresponding longitudinal axis along an elongated length thereof, the fastening strap protruding outwardly from the base strap such that the longitudinal axis of the one or more fastening straps is perpendicular to the longitudinal axis of the base strap, the one or more fastening straps including ends located on oppositely disposed sides of the base strap;
   the method further comprising:
   transitioning from the open configuration to the fully closed configuration by bending the base strap along the longitudinal axis thereof, bending the one or more fastening straps along the longitudinal axis thereof, coupling the base strap to the one or more fastening straps such that the one or more fastening straps and base strap are retained in bent configurations and define the compartment configured to removably store the device.

16. The method of claim 15, the method comprising inserting at least a first of the one or more fastening straps through one or more slots in the base strap such that the first fastening strap extends across the base strap with portions extending outward therefrom in oppositely-disposed and aligned directions.

17. The method of claim 15, the method further comprising coupling a slot in a first of the ends of the one or more fastening straps to a button on an oppositely-disposed second of the ends of the one or more fastening straps by inserting the button into the slot.

18. The method of claim 15, wherein the lower portion comprises at least two of the base strap to define a gap therebetween that forms the slot that allows the electrical cord to pass therethrough and connect with the device within the compartment, and the lower portion comprises one or more support straps connecting and laterally stabilizing the base straps.

19. The method of claim 15, the method comprising
   removing the device from the lower portion of the storage apparatus;
   removing the upper portion of the storage apparatus from the plug; and
   transitioning from the fully closed configuration to the open configuration by decoupling the base strap from the one or more fastening straps and bending the base strap and the one or more fastening straps such that the upper and lower portions are substantially planar.

* * * * *